United States Patent
Shih et al.

(10) Patent No.: US 8,039,195 B2
(45) Date of Patent: Oct. 18, 2011

(54) SI DEVICE MAKING METHOD BY USING A NOVEL MATERIAL FOR PACKING AND UNPACKING PROCESS

(75) Inventors: Jen-Chieh Shih, Jhubei (TW); Hsiao-Wei Yeh, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 576 days.

(21) Appl. No.: 12/028,580

(22) Filed: Feb. 8, 2008

(65) Prior Publication Data

US 2009/0203224 A1    Aug. 13, 2009

(51) Int. Cl.
G03F 7/00 (2006.01)
G03F 7/004 (2006.01)
G03F 7/26 (2006.01)
G03F 7/20 (2006.01)

(52) U.S. Cl. ...... 430/270.1; 430/5; 430/273.1; 430/312; 430/322; 430/325; 430/330; 430/331; 430/394; 430/913; 430/927

(58) Field of Classification Search ........... 430/5, 270.1, 430/273.1, 311, 312, 322, 325, 330, 331, 430/394, 913, 927
See application file for complete search history.

(56) References Cited

U.S. PATENT DOCUMENTS

| | | | |
|---|---|---|---|
| 6,337,175 B1* | 1/2002 | Yamaguchi | 430/322 |
| 6,383,952 B1 | 5/2002 | Subramanian et al. | |
| 6,593,063 B1* | 7/2003 | Tanaka et al. | 430/311 |
| 6,664,011 B2 | 12/2003 | Lin et al. | |
| 6,703,323 B2 | 3/2004 | Kong et al. | |
| 6,740,473 B1* | 5/2004 | Lin et al. | 430/315 |
| 6,986,980 B2* | 1/2006 | Kubota et al. | 430/156 |
| 6,998,198 B2 | 2/2006 | Lin et al. | |
| 7,094,686 B2 | 8/2006 | Oweyang et al. | |
| 7,235,348 B2 | 6/2007 | Ho et al. | |
| 7,527,918 B2* | 5/2009 | Kondoh et al. | 430/312 |
| 7,550,248 B2* | 6/2009 | Namiki et al. | 430/270.1 |
| 7,592,127 B2* | 9/2009 | Nozaki et al. | 430/273.1 |
| 7,625,688 B2* | 12/2009 | Nozaki et al. | 430/270.1 |
| 7,662,539 B2* | 2/2010 | Nozaki et al. | 430/273.1 |
| 7,666,578 B2* | 2/2010 | Fischer et al. | 430/314 |
| 7,759,253 B2* | 7/2010 | Chang | 438/706 |
| 2005/0255411 A1* | 11/2005 | Frost et al. | 430/312 |
| 2006/0154182 A1 | 7/2006 | Brodsky | |
| 2007/0048670 A1 | 3/2007 | Choi et al. | |
| 2008/0160770 A1* | 7/2008 | Bok | 438/703 |
| 2009/0081595 A1* | 3/2009 | Hatakeyama et al. | 430/323 |
| 2009/0142926 A1* | 6/2009 | Dai et al. | 438/703 |
| 2009/0226844 A1* | 9/2009 | Nozaki et al. | 430/296 |
| 2010/0086878 A1* | 4/2010 | Hatakeyama et al. | 430/324 |
| 2010/0099261 A1* | 4/2010 | Lee | 438/694 |

FOREIGN PATENT DOCUMENTS

EP    1757989    2/2007

OTHER PUBLICATIONS

Chinese Patent Office, Office Action mailed Apr. 8, 2010, Application No. 200910005762.X, 4 pages.

* cited by examiner

*Primary Examiner* — Amanda C. Walke
(74) *Attorney, Agent, or Firm* — Haynes and Boone, LLP

(57) ABSTRACT

A method of lithography patterning includes forming a resist pattern on a substrate, the resist pattern including at least one desired opening and at least one padding opening therein on the substrate; forming a patterned photosensitive material layer on the resist pattern and the substrate, wherein the patterned photosensitive material layer covers the padding opening of the resist pattern; and applying a resolution enhancement lithography by assist of chemical shrink (RELACS) process to the desired opening of the resist pattern.

17 Claims, 12 Drawing Sheets

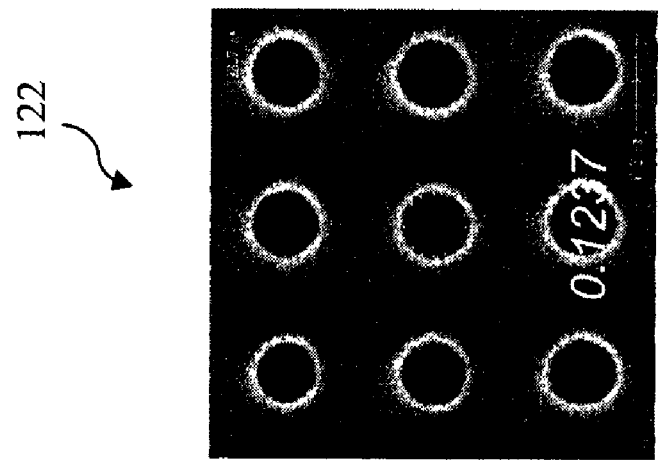
Fig. 4B
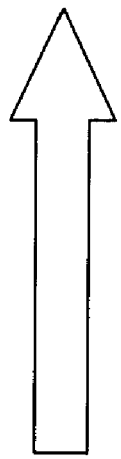
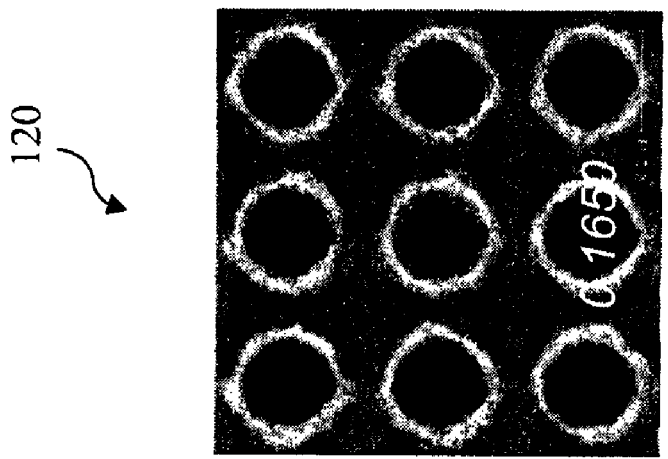
Fig. 4A

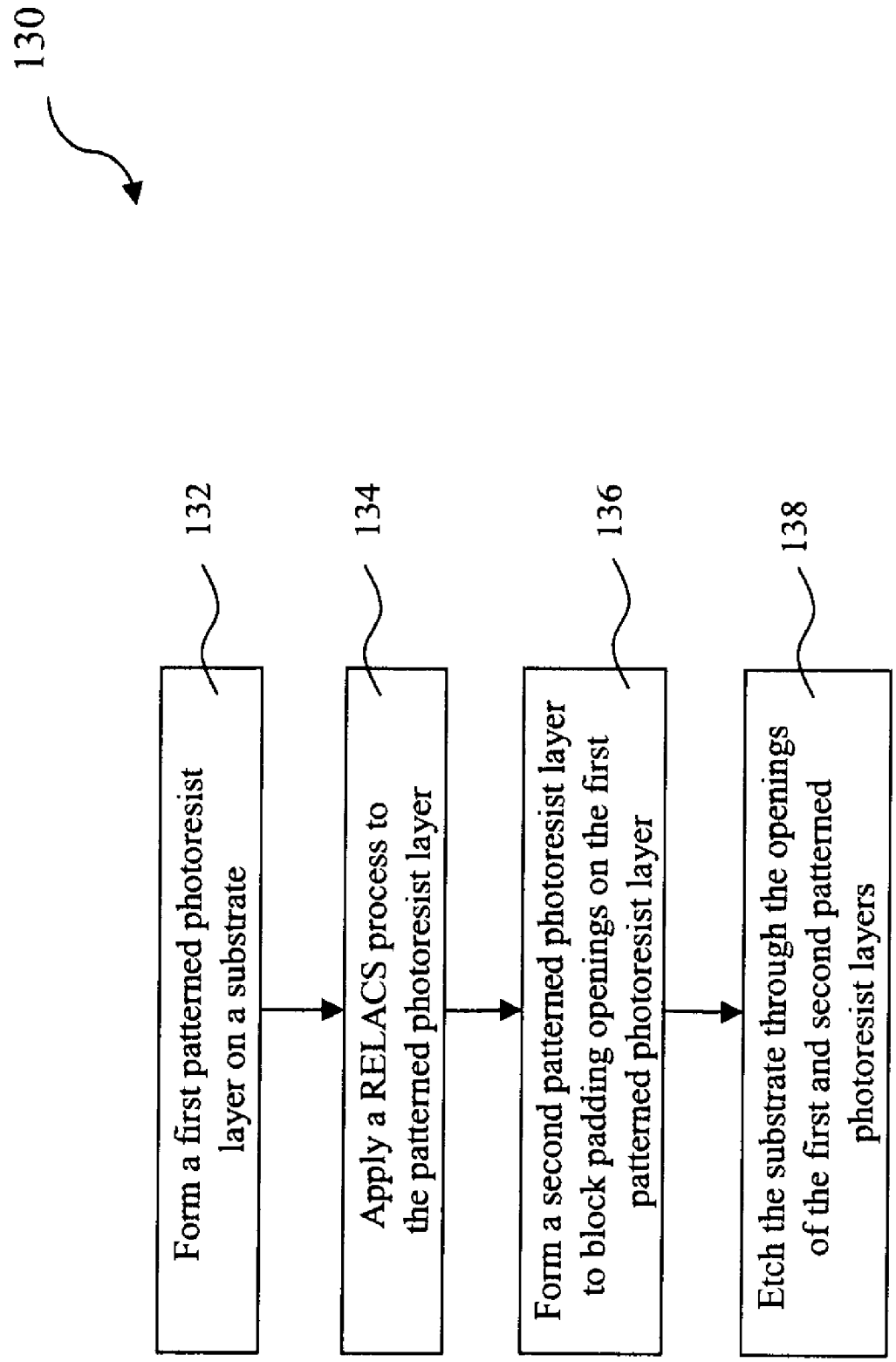

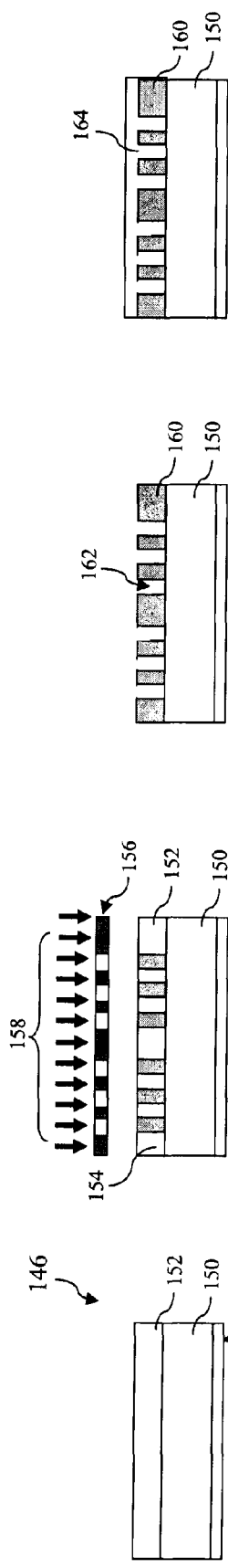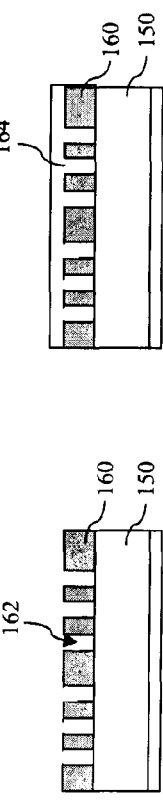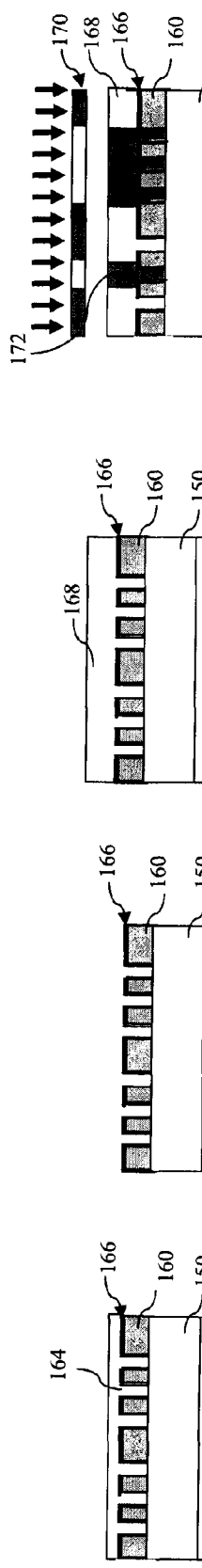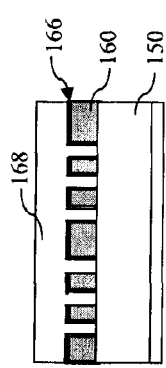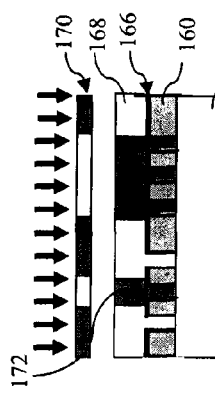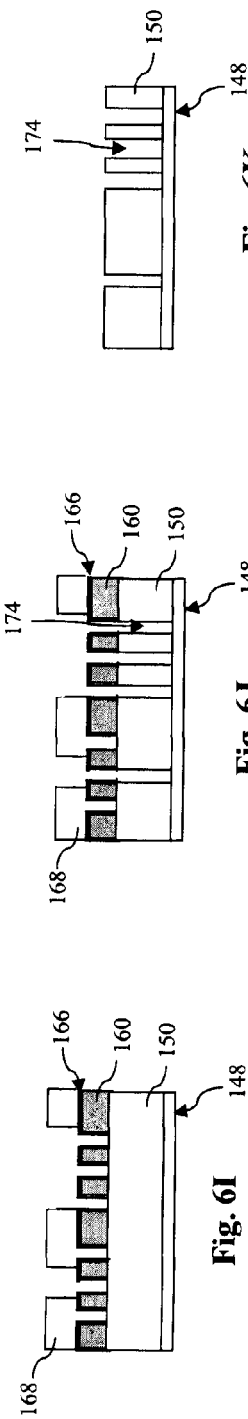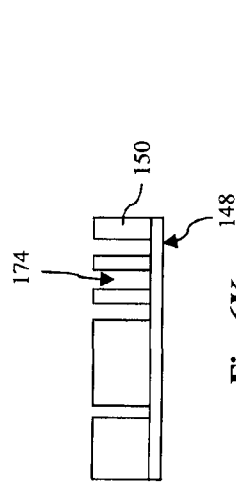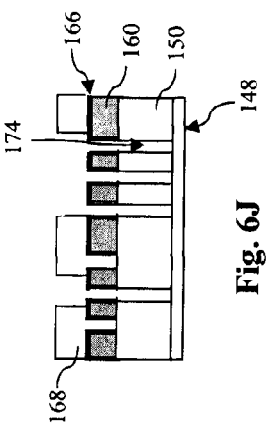

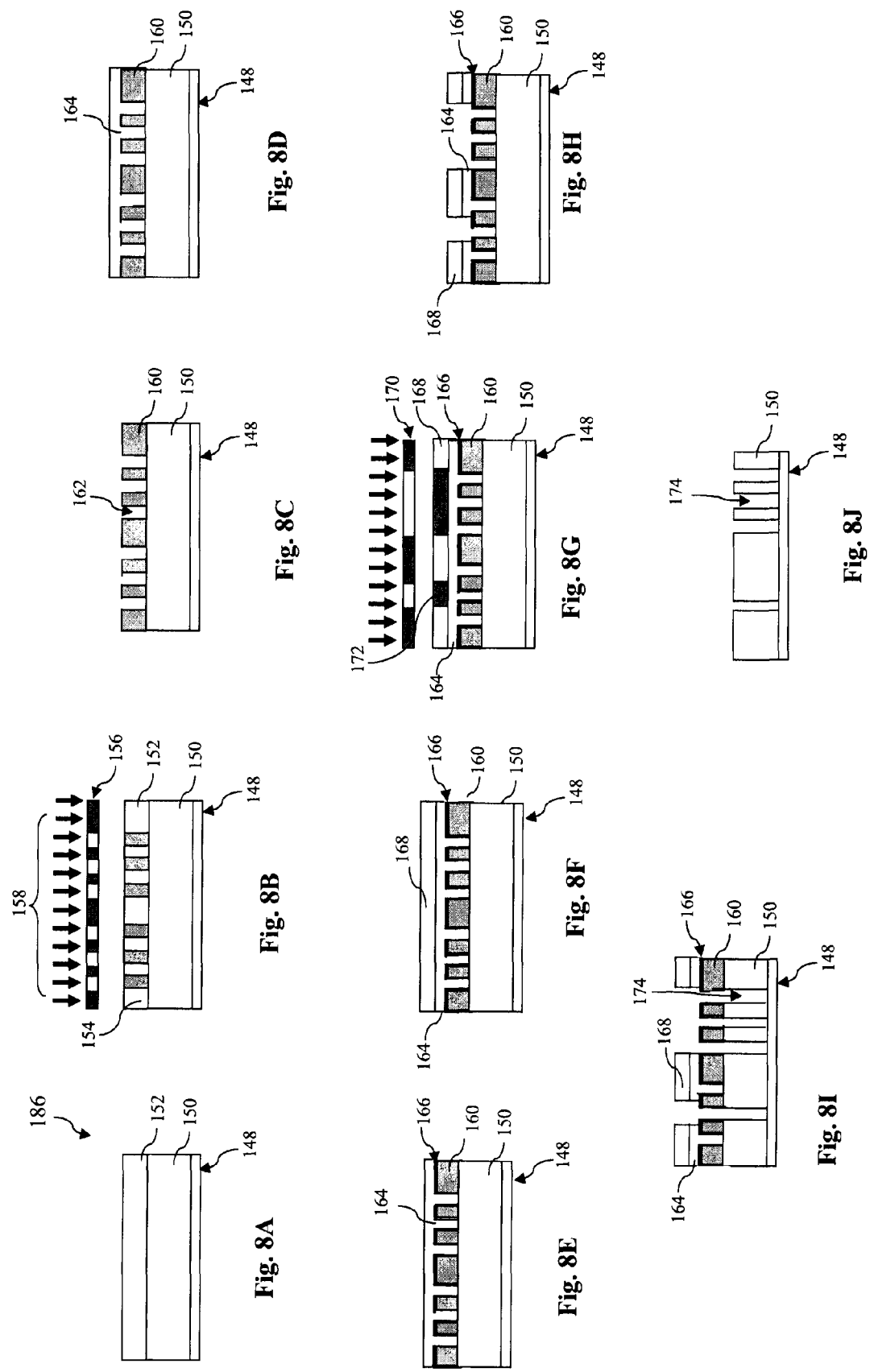

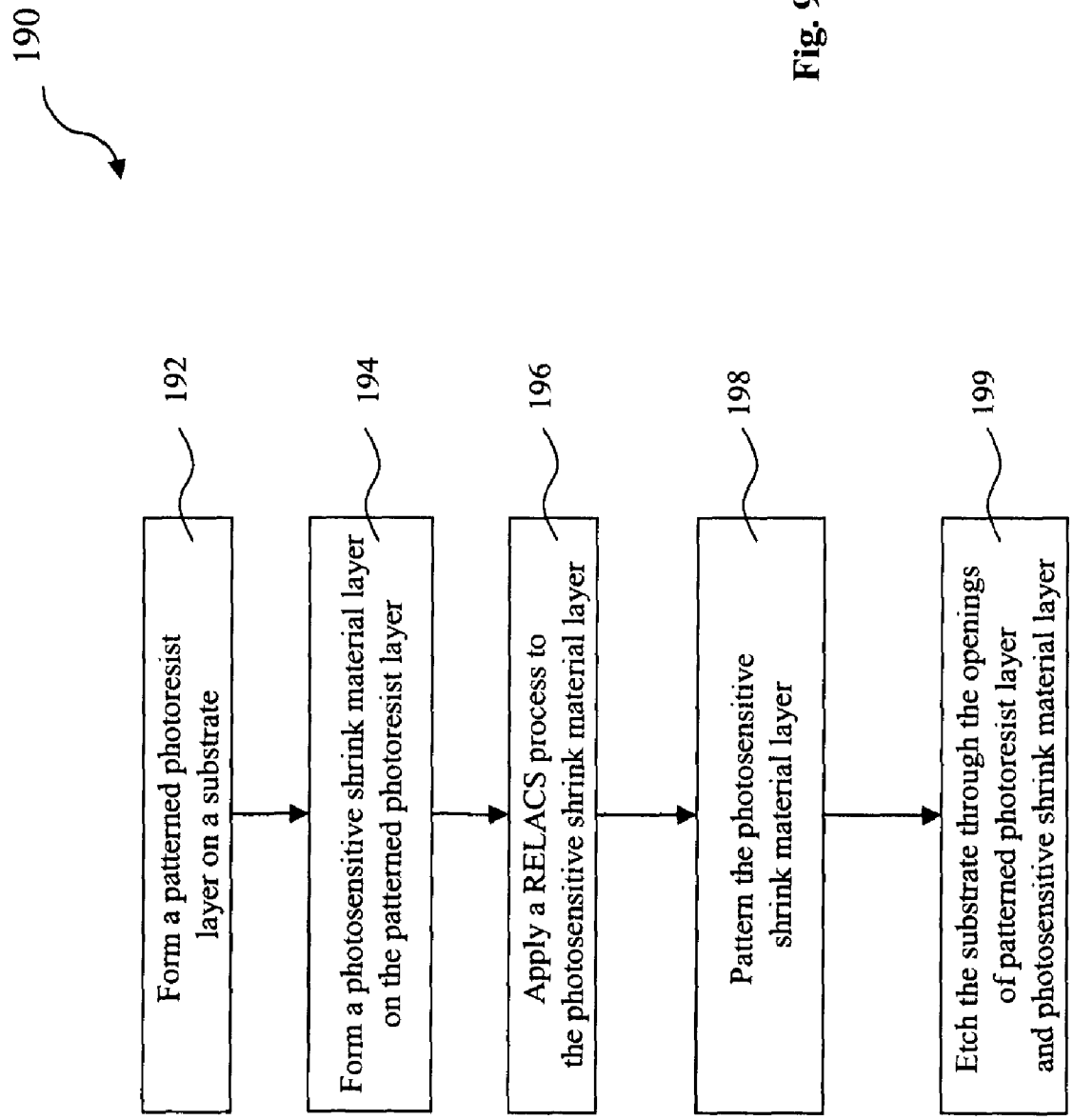

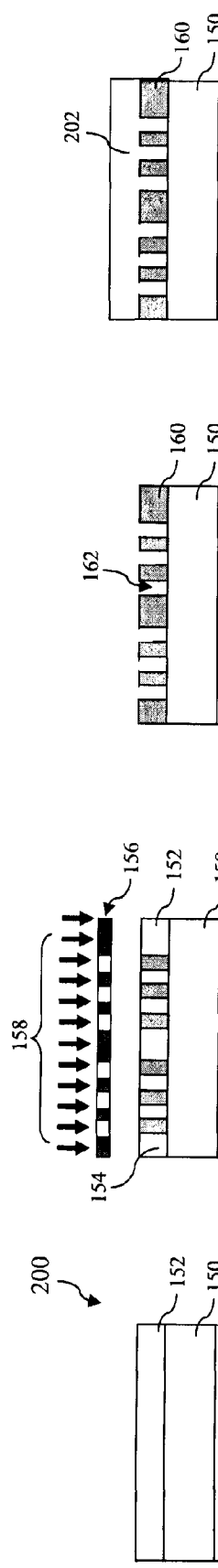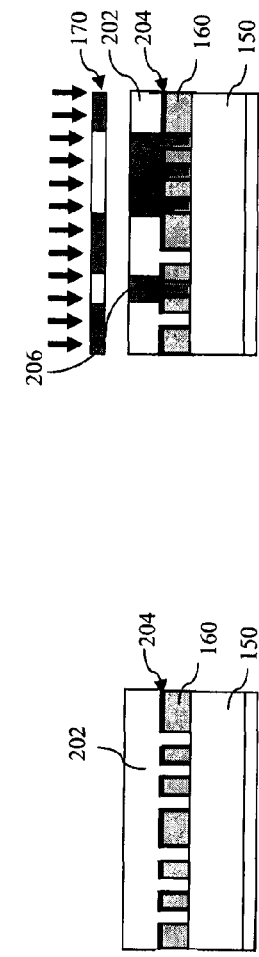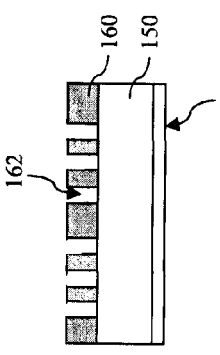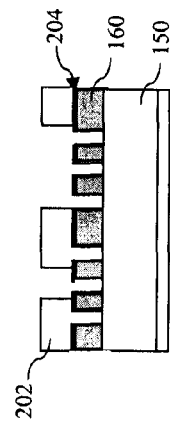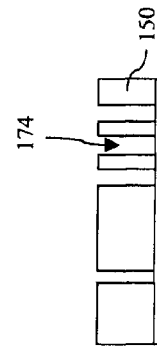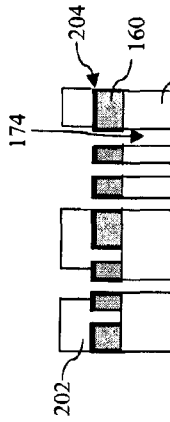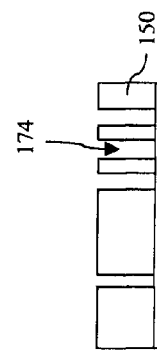

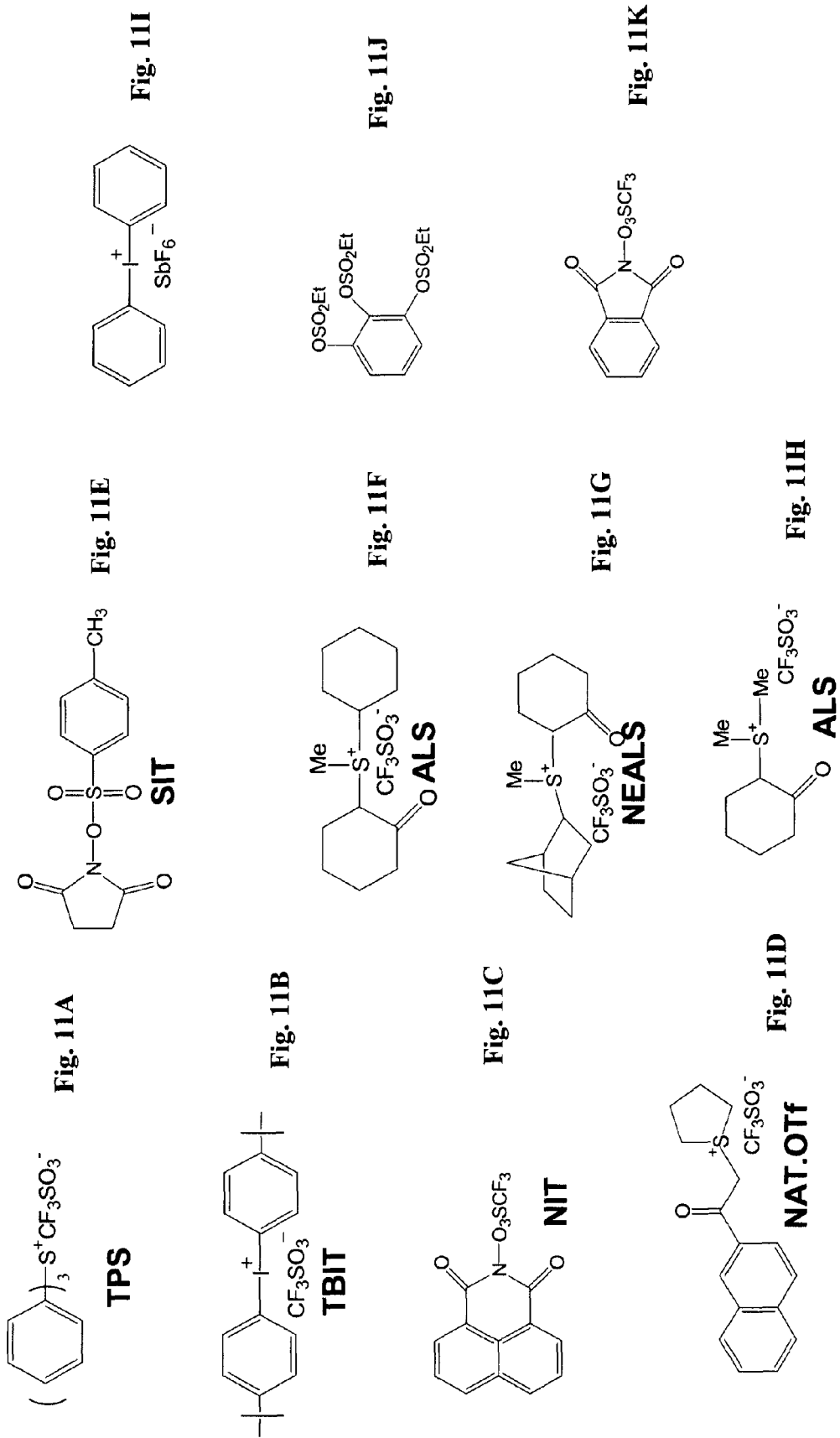

SI DEVICE MAKING METHOD BY USING A NOVEL MATERIAL FOR PACKING AND UNPACKING PROCESS

BACKGROUND

Semiconductor technologies are continually progressing to smaller feature sizes, for example down to feature sizes of 65 nanometers, 45 nanometers, and below. A patterned photoresist (resist) layer used to produce such small feature sizes typically has a high aspect ratio. Maintaining a desired critical dimension (CD) can be very difficult for various reasons, especially for a resist layer with a high aspect ratio. For example, a loading effect of the resist layer may cause CD variation and degradation during a lithography patterning process.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

FIGS. 4A and 4B are top views of one embodiment of a semiconductor device constructed according to various aspects of the present disclosure.

FIG. 5 is a flowchart showing one embodiment of a lithography patterning method.

FIGS. 6A through 6K are sectional views of one embodiment of a semiconductor device, fabricated by the method of FIG. 5, during various fabrication stages.

FIGS. 8A through 8J are sectional views of another embodiment of a semiconductor device, fabricated by the method of FIG. 7, during various fabrication stages.

FIG. 9 is a flowchart showing another embodiment of a lithography patterning method.

FIGS. 10A through 10I are sectional views of another embodiment of a semiconductor device, fabricated by the method of FIG. 9, during various fabrication stages.

FIGS. 11A through 11K show various embodiments of a photoacid generator (PAG) constructed according to aspects of the present disclosure.

DETAILED DESCRIPTION

Figure 1:
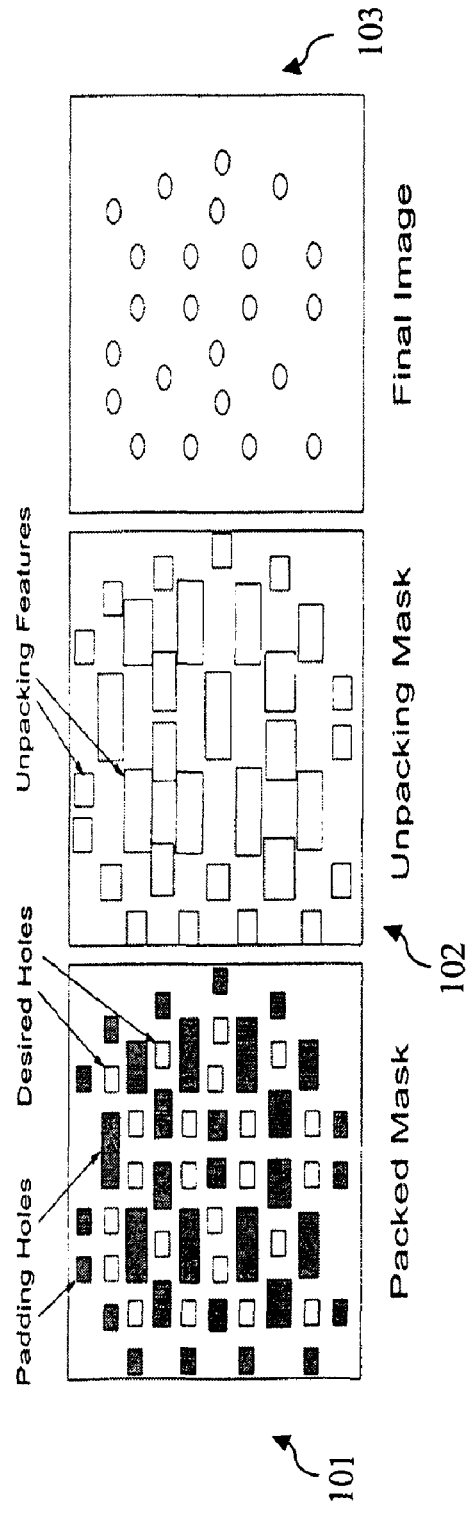
FIGS. 1 and 2 are top views of two embodiments of a semiconductor device and photomasks used during various fabrication stages constructed according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
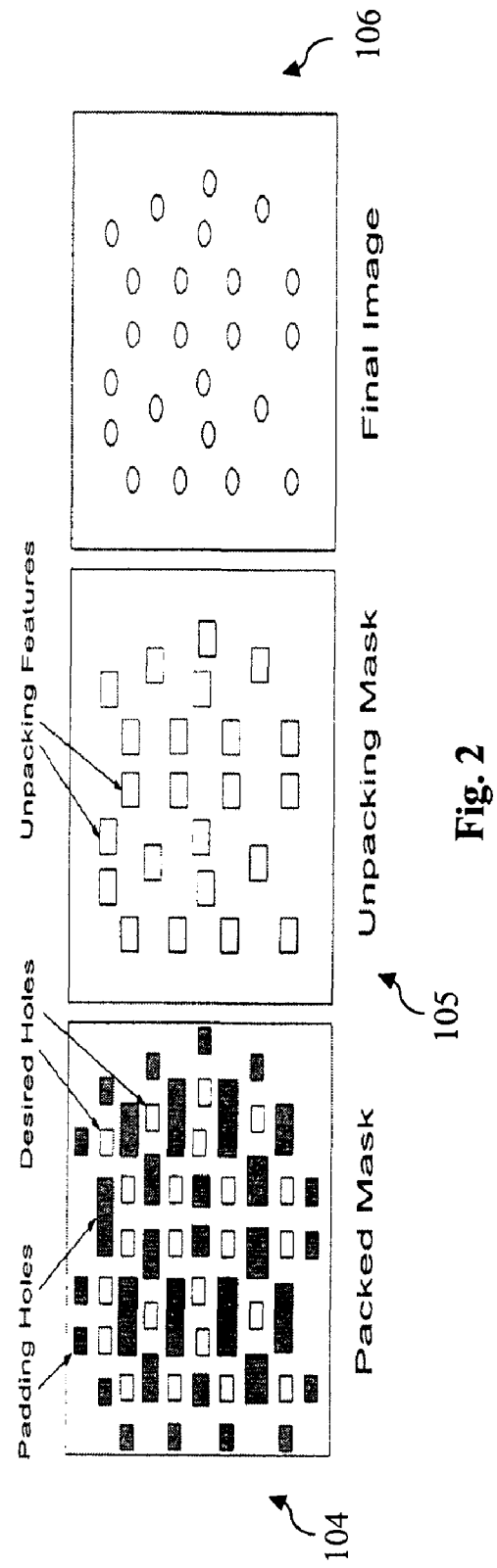

FIGS. 1 and 2 are top views of two embodiments of a semiconductor device and photomasks (masks) used during various fabrication stages. FIGS. 3A through 3D are sectional views of one embodiment of a semiconductor device during various fabrication stages. With reference to FIGS. 1, 2 and 3A through D, a lithography packing and unpacking (PAU) patterning method is described below according to various aspects of the present disclosure.

In one embodiment, a first photoresist (resist) layer is formed on a substrate, such as a semiconductor wafer, and is patterned using a first mask 101 defining the desired openings and the padding openings. The desired openings can be contact holes in one example. The padding openings are designed and configured to approximate the desired openings to reduce the CD deviation caused by the loading effect, in one embodiment. A second photosensitive layer is then formed on the first resist layer and is patterned using a second mask 102 having unpacking features. The second photosensitive layer includes negative photoresist material in one example. The unpacking features include openings associated with the padding openings. For example, the unpacking features in the second mask 102 include openings enclosing the padding openings. Therefore, the patterned second photosensitive layer covers the padding openings and exposes the desired openings of the first photoresist layer. An etching process, such as a dry etching process, is implemented to etch the substrate through the desired openings, defined by the first and second photoresist layers, to form the desired integrated circuit features, such as contact holes, in the substrate as illustrated in a top view of an integrated circuit device 103.

In another embodiment of the lithography PAU patterning method, a first resist layer is formed on a substrate, such as a semiconductor wafer, and is patterned using a first mask 104 defining desired openings and padding openings. The desired openings include contact holes in one example. The padding openings are designed and configured to approximate the desired openings to reduce the CD deviation caused by the loading effect. A second photosensitive layer is then formed on the first photoresist layer and is patterned using a second mask 105 having unpacking features. The second photosensitive layer includes positive photoresist material in one example. The unpacking features include openings associated with the desired openings. For example, the unpacking features in the second mask 105 include openings enclosing the desired openings. Therefore, the patterned second photosensitive layer covers the padding openings and exposes the desired openings of the first photoresist layer. An etching process, such as a dry etching process, is implemented to etch the substrate through the desired openings, defined by the first and second photoresist layers, to form the desired integrated circuit features, such as contact holes, in the substrate as illustrated in a top view of an integrated circuit device 103.

The lithography PAU patterning method further includes a chemical shrink process, also referred to as resolution enhancement lithography by assist of chemical shrink (RELACS), to reduce CD and/or enlarge depth of focus (DoF) in various embodiments. The chemical shrink process integrated with the lithography PAU patterning method is described below with further reference to FIGS. 3A through 3D.

Figures 3A, 3B, 3C, 3D:
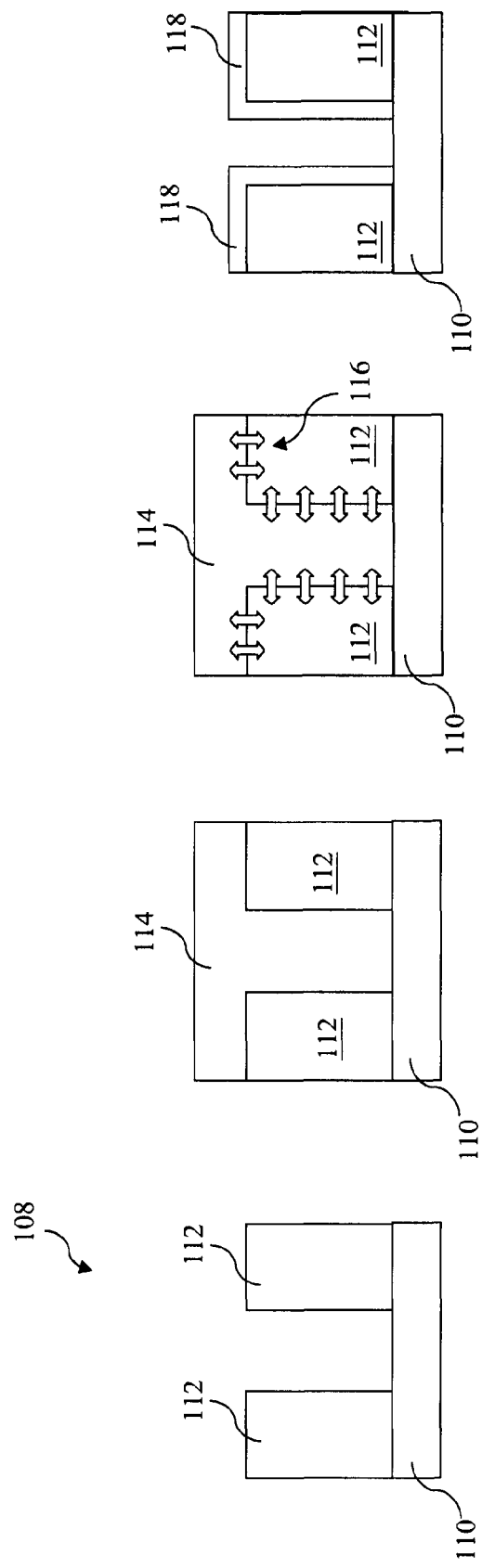
FIGS. 3A through 3D are sectional views of one embodiment of a semiconductor device during various fabrication stages constructed according to various aspects of the present disclosure.

FIGS. 3A through 3D are sectional views of one embodiment of a semiconductor device 108 during various fabrication stages constructed according to various aspects of the present disclosure. After the first resist layer 112 is formed on the substrate 110 and is patterned to form various openings, a RELACS material layer 114 is formed on the first photoresist layer 112 and on the substrate within the openings of the first resist layer as illustrated in FIG. 3C. The RELACS material includes crosslinkable polymer and crosslinker. Then a baking process can be implemented to enhance the diffusion of the acid from the resist pattern to the RELACS material to crosslink the crosslinkable polymer (116 in FIG. 3C), resulting in an interfacial crosslinked polymer layer (an interfacial layer) 118 adjacent the resist pattern, as shown in FIG. 3D. In one example, the baking process includes a baking temperature between about 100° C. and about 200° C. In another example, the baking process includes a baking duration ranging between about 30 seconds and about 2 minutes. A rinsing process is then applied to remove uncrosslinked polymer. The interfacial layer will shrink the desired openings to smaller diameters. The rinsing process may be applied after the patterning of the second resist pattern or combined with the developing process of the second resist pattern. In one embodiment when the desired openings are designed to create contact holes, the contact holes 120 in FIG. 4A are shrunk to contact holes 122 in FIG. 4B with smaller diameters. FIGS. 4A and 4B are top views of a semiconductor device having various openings of the first resist pattern before and after the RELACS process. In one example, the interfacial layer has a thickness ranging between about 100 nm and 200 nm. The thickness of the interfacial layer is tunable by the baking temperature and/or the baking duration of the baking process.

The disclosed method may have various variations. For example, the second resist pattern may use a negative resist or positive resist. In another example, the second resist layer may be combined with the RELACS material into one photosensitive shrinkage material. In such case, the RELACS process and patterning process of the second resist pattern are also combined in a sequence to apply to the photosensitive shrinkage material such that the photosensitive shrinkage material is crossslinked at the interface and is patterned to expose the desired openings. In another embodiment, the first resist pattern may further include an anti-reflective coating (ARC) layer.

Various exemplary embodiments of the present disclosed method are described below with further details. FIG. 5 is a flowchart showing one embodiment of a lithography patterning method 130. FIGS. 6A through 6K are sectional views of one embodiment of a semiconductor device 146 fabricated by the method 130 during various fabrication stages. With reference to FIGS. 5 and 6A through 6K, the method 130 for lithography patterning and the semiconductor device 146 made thereby are collectively described, in a first embodiment.

Referring to FIGS. 5 and 6A through 6C, the method 130 begins at step 132 by forming a first patterned resist layer (first resist pattern) on a substrate 148. The substrate 148 includes silicon. The substrate 148 may alternatively be made of some other suitable semiconductor material, including Ge, SiGe, or GaAs. Further, the substrate 148 may be made of some other suitable elementary semiconductor such as diamond; a suitable compound semiconductor such as silicon carbide, indium arsenide, or indium phosphide; or a suitable alloy semiconductor such as silicon germanium carbide, gallium arsenic phosphide, or gallium indium phosphide. Alternatively, the substrate 148 may be a non-semiconductor material such as a glass substrate for thin-film-transistor liquid crystal display (TFT-LCD) devices, fused quartz, or calcium fluoride for a photomask (mask or reticle). The substrate 148 may include various doped regions, dielectric features, and multilevel interconnects. In one embodiment, the substrate 148 includes various doped features for various microelectronic components, such as complementary metal-oxide-semiconductor field-effect transistor (CMOSFET), imaging sensor, memory cell, and/or capacitive element. In another embodiment, the substrate 148 includes conductive material features and dielectric material features configured for coupling and isolating various microelectronic components, respectively.

In another embodiment, the substrate 148 includes one or more material layers 150, formed thereon, to be patterned for various openings (trenches or holes). The material layer 150 may be silicon, poly-silicon, dielectric material, conductive material, and combinations thereof. In one embodiment, the material layer 150 includes a dielectric material for interlayer dielectric (ILD) or inter-metal dielectric (IMD). The dielectric material includes silicon oxide and/or low dielectric-constant (low-k) dielectric material with a dielectric constant being less than about 4. For example, the low-k dielectric material may be a material selected from the group consisting of fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other proper porous polymeric materials.

A first resist layer 152 is formed on the material layer 150 by a technique such as spin-on coating method. As one example, the first resist layer 152 is formed on material layer 150 and then patterned by a first lithography process using a first mask 156 defining at least one desired opening and at least one padding opening illustrated in FIG. 6B. During a lithography exposing process, the first resist layer is exposed by a radiation to form a plurality of exposed regions 154 (or non-exposed region for the negative resist) defined by the first mask 156. The first resist layer may have a thickness ranging between about 100 angstroms and 5000 angstroms. In various examples, the first resist pattern may have a thickness ranging between about 500 angstroms and 3000 angstroms, or between about 1000 angstroms and 1500 angstroms. The resist material of the first resist layer 152 can be a positive-type resist or a negative-type resist. For advanced semiconductor patterning using an extreme ultraviolet (EUV) radiation beam, the first resist layer 152 may use a chemical amplification (CA) resist. The first resist layer 152 may include acid molecular or radiation-sensitive acid generator, such that acid can be generated when a radiation beam is applied. The first resist pattern is formed by the first lithography process that may include processing steps of resist coating, soft baking, mask aligning, exposing, post-exposure baking, developing, and hard baking. For illustration, the lithography exposing process may be carried out by exposing the semiconductor device 146 under a radiation 158 through the first mask 156. The radiation may be ultraviolet (UV) or EUV, such as a 248 nm beam from a Krypton Fluoride (KrF) excimer laser, or a 193 nm beam from an Argon Fluoride (ArF) excimer laser. The lithography process may utilize other exposing modes, such as on-axis, off-axis, quadripole, or dipole exposure technologies. The lithography patterning may alternatively be implemented or replaced by other proper methods such as maskless lithography, electron-beam writing, ion-beam writing, and molecular imprint techniques.

The first resist layer 152 is then developed. The plurality of openings 162 are formed in the first resist pattern 160 by the developing process. The openings 162 defined in the first resist pattern 160 include at least one desired opening and at least one padding opening. The desired opening is defined for the expected feature of the semiconductor device 146. The padding opening is configured to reduce or eliminate the CD deviation caused by the loading effect.

Figure 13:
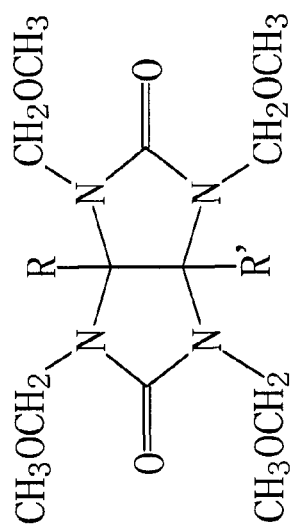
FIG. 13 shows one embodiment of a crosslinker constructed according to aspects of the present disclosure.
Figure 12B:
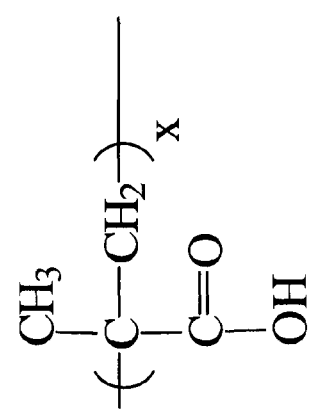
FIGS. 12A and 12B show various embodiments of a crosslinkable polymer constructed according to aspects of the present disclosure.
Figure 12A:
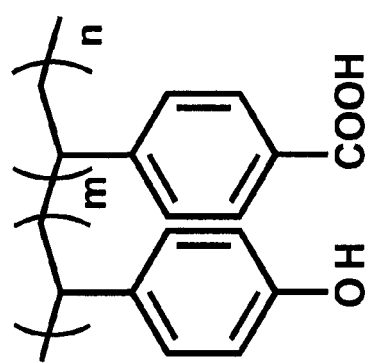

Referring to FIGS. 5 and 6D through 6F, the method 130 proceeds to step 134 by applying a RELACS process to the first resist pattern 160. In one embodiment, the RELACS process includes coating a RELACS material layer 164 on the first resist pattern 160 and on the material layer 150 within the openings of the first resist pattern as shown in FIG. 6D. The RELACS material 164 includes crosslinkable polymer and crosslinker. In one embodiment, the crosslinkable polymer includes OH group and/or COOH group such as those exemplary crosslinkable polymers shown in FIGS. 12A and 12B. In another embodiment, the crosslinkable polymer includes epoxy. FIG. 13 provides one embodiment of the crosslinker for the photosensitive shrinkage material.

Figure 14:
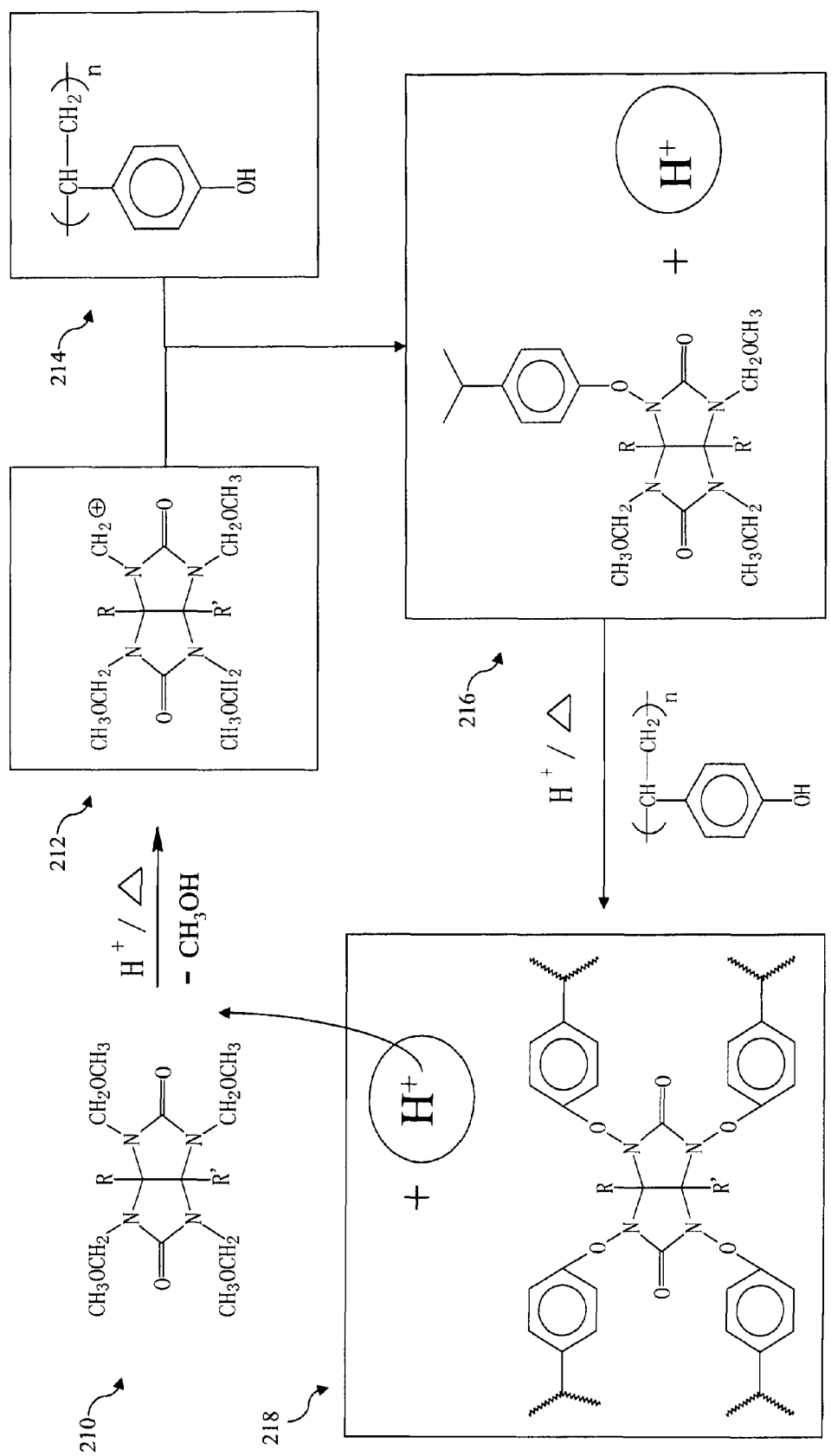
FIG. 14 illustrates a schematic view of one embodiment of a reaction scheme of a crosslinking-type photoresist constructed according to aspects of the present disclosure.

The RELACS process includes baking the RELACS material layer and the first resist pattern 160. The baking process enhances the diffusion of the acid from the resist pattern to the RELACS material to crosslink the crosslinkable polymer, resulting in an interfacial crosslinked polymer layer (an interfacial layer) 166 between the RELACS material layer and the first resist pattern, as illustrated in FIG. 6E. In another embodiment as illustrated in FIG. 14, when receiving an acid ion, a crosslinker 210 is changed to a chemical structure 212 with an unpaired chemical bond. The crosslinker 212 can react with a crosslinkable polymer 214 and therefore chemically bonds therewith. An acid ion may be released therefrom and can further induce another bonding reaction between a crosslinker and a crosslinkable polymer as shown in 218. Thus, the crosslinkable polymers can be linked together and form an interfacial layer.

In one example, the baking process includes a baking temperature between about 100° C. and about 200° C. In another example, the baking process includes a baking duration ranging between about 30 seconds and about 2 minutes. The RELACS process also includes rinsing the RELACS material to remove the uncrosslinked polymer, leaving the interfacial layer 166 adjacent the first resist pattern 152 as illustrated in FIG. 6F. In one example, the interfacial layer has a thickness ranging between about 100 nm and 200 nm. The thickness of the interfacial layer is tunable by the baking temperature and/or the baking duration of the baking process. The RELACS process, by forming the interfacial layer, can reduce CD of the desired openings of the first resist pattern and/or enlarge depth of focus (DoF) in various embodiments.

Referring to FIGS. 5 and 6G through 6I, the method 130 proceeds to step 136 by forming a second resist pattern, by a second lithography process, on the material layer 150 and optionally on the first resist pattern 160. A second resist layer 168 is deposited by a technique such as spin-on coating. In one embodiment, the second resist layer 168 is deposited on the first resist pattern 160 and the material layer 150 as shown in FIG. 6G.

The second resist layer is then patterned to form the second resist pattern, by a second lithography process using a second mask 170 defining at least one desired opening and at least one padding opening as illustrated in FIG. 6H. The second resist pattern includes a plurality of exposed regions 172 (or non-exposed region for the negative resist) defined by the second mask 170. In one embodiment, the second resist layer is substantially similar to the first resist layer in terms of composition and thickness. For example, the resist material of the second resist layer can be a positive-type resist or a negative-type resist. In another example, the second resist layer includes a chemical amplification (CA) resist. The second resist pattern is formed by the second lithography process that may include processing steps of resist coating, soft baking, mask aligning, exposing, post-exposure baking, developing, and hard baking. After the second resist layer is developed, the plurality of openings are formed therein, exposing the desired openings of the first resist pattern 160. The padding openings of the first resist pattern 160 are covered by the second resist pattern as illustrated in FIG. 6I. In one embodiment, the second lithography process may use a lithography apparatus and the second mask with precisions lower than those of the first lithography process since the second resist pattern is used to cover the padding openings of the first resist pattern. For example, a larger misalignment may be acceptable if the second resist pattern fully covers the padding openings of the first resist pattern. In another embodiment, a larger CD variation is acceptable if the second resist pattern is able to fully cover the padding openings of the first resist pattern.

Referring to FIGS. 5 and 6J through 6K, the method 130 proceeds to step 138 by etching the material layer 150 (or the substrate 148) through the desired openings of the first resist pattern 160. The desired openings are further shrunk by the interfacial layer 166 and uncovered by the second resist pattern 168. An etching process is applied to the material layer 150 to remove the material layer within the desired openings to form trenches 174 in the material layer as illustrated in FIG. 6J. In one example, the material layer 150 within the desired openings is removed by the etching process such that the top surfaces of the substrate 148 within the desired openings are fully exposed. Etchant used in the etching process can be chosen and/or tuned to selectively remove the material layer relative to the first resist pattern, the second resist pattern, and/or the substrate. As an example, the etch process may use a $CF_4$, $C_3F_8$, $C_4F_8$, $CHF_3$, $CH_2F_2$ dry etch or a buffered hydrofluoric acid (BHF) wet etch to remove silicon oxide when silicon oxide is used for the material layer.

Both the first resist pattern 152 and the second resist pattern 168 are removed thereafter. In one example, a resist ashing process is used to remove the first and second resist patterns. In another example, a wet stripping process is used to remove the first and second resist patterns. After the removal of the first and second resist patterns, the substrate 148 is exposed within the trenches 174 defined in the material layer 150 as illustrated in FIG. 6K. The patterned material layer has trenches 174 defined by the desired openings. In one example, the trenches 174 are formed as contact holes for metal interconnects.

The method described above with reference to FIGS. 5 and 6A through 6K provides a patterning process constructed according to various aspects of the present disclosure. This method implements the PAU process and the RELACS process to form desired openings in a material layer with reduced CD variation and enhanced DoF. Other advantages may be further present in various embodiments. For example, the openings 174 (or trenches) formed in the material layer 150 have smoother edges and/or reduced dimensions. In one example, the method 130 can be used to form small contact holes.

Figure 7:
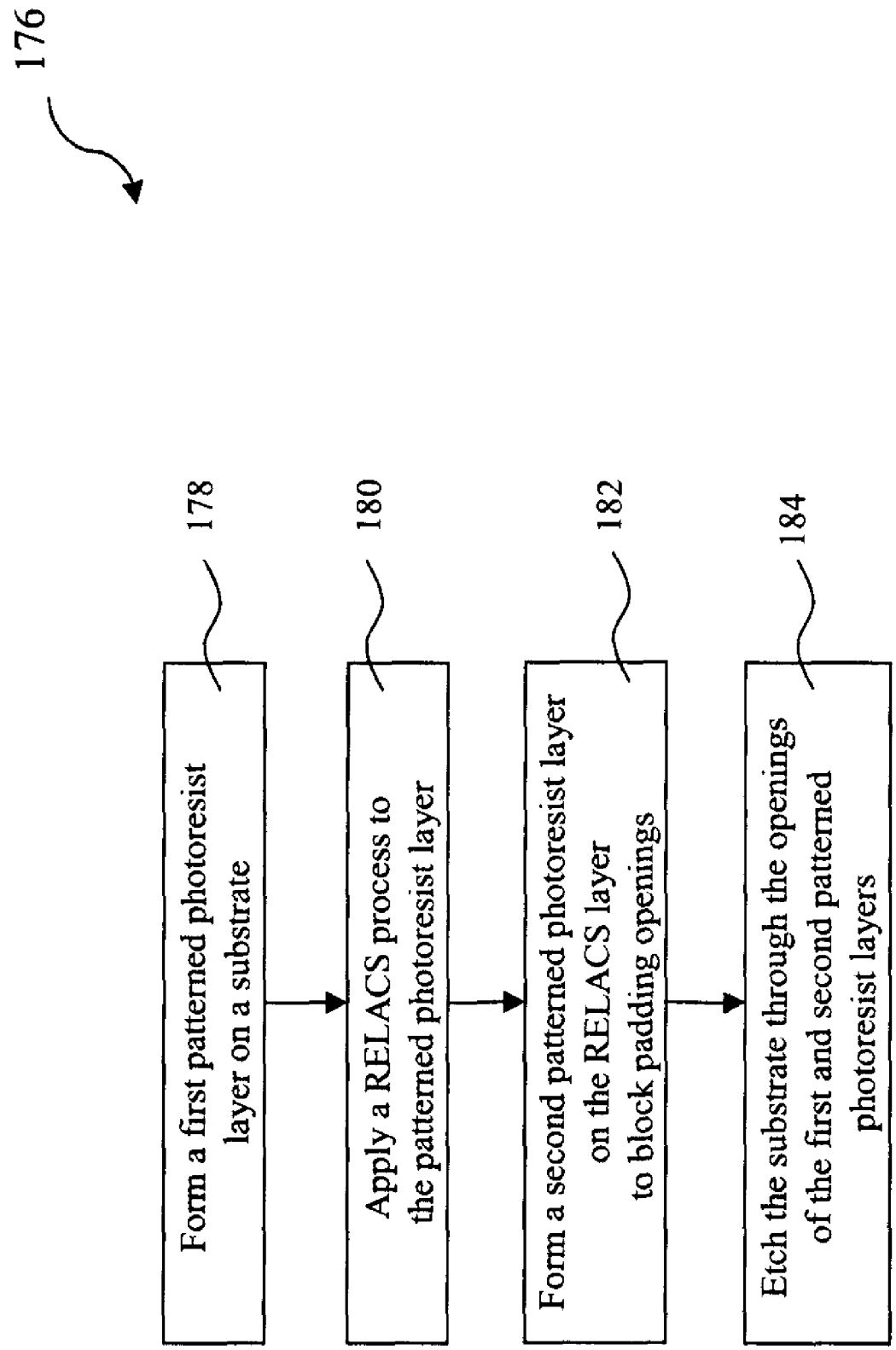
FIG. 7 is a flowchart showing another embodiment of a lithography patterning method.

Another embodiment of the disclosed lithography patterning method is provided below. FIG. 7 is a flowchart showing a lithography patterning method 176. FIGS. 8A through 8J are sectional views of one embodiment of a semiconductor device 186 fabricated by the method 176 during various fabrication stages. With reference to FIGS. 7 and 8A through 8J, the method 176 for lithography patterning and the semiconductor device 186 made thereby are collectively described. The description of this embodiment is concise for simplicity.

Referring to FIGS. 7 and 8A through 8C, the method 176 begins at step 178 by forming a first resist pattern on a substrate 148. In one example, the first resist pattern 160 of the semiconductor device 186 is substantially similar to the first resist pattern 160 of the semiconductor device 146 in terms of composition, formation, and configuration. For example, the first resist pattern includes at least one desired opening and at least one padding opening. In another example, the desired opening is defined for the expected feature of the semiconductor device 186. The padding opening is configured to reduce the CD deviation caused by the loading effect.

Referring to FIGS. 7 and 8D through 8E, the method 176 proceeds to step 180 by applying a RELACS process to the first resist pattern 160. In one embodiment, the RELACS process includes coating a RELACS material layer 164 on the first resist pattern 160 and on the material layer 150 within the openings of the first resist pattern as shown in FIG. 8D. In one embodiment, the RELACS material 164 is substantially similar to the RELACS material used in the method 130 in term of composition. The RELACS process includes baking the RELACS material layer and the first resist pattern 160 to crosslink the crosslinkable polymer, resulting in an interfacial crosslinked polymer layer (an interfacial layer) 166 between the RELACS material layer and the first resist pattern. In one embodiment, the baking process is substantially similar to the baking process used in the method 130. However, the uncrosslinked polymer is not rinsed at the current stage.

Referring to FIGS. 7 and 8F through 8H, the method 176 proceeds to step 182 by forming a second resist pattern on the RELACS material layer 164 and overlying the padding openings of the first resist pattern by a second lithography process. The second resist layer is deposited by a technique such as spin-on coating. The second resist layer 168 is deposited on the RELACS material layer 164 as shown in FIG. 8F.

The second resist layer is then patterned to form the second resist pattern, by a second lithography process using a second mask 170 defining at least one desired opening and at least one padding opening as illustrated in FIG. 8G. The second resist pattern forms, in a lithography exposing process, a plurality of exposed regions 172 (or non-exposed region for the negative resist) defined by the second mask 170. The second resist pattern is formed by the second lithography process that may include processing steps of resist coating, soft baking, mask aligning, exposing, post-exposure baking, developing, and hard baking. In one embodiment, the uncrosslinked polymer of the RELACS material layer 164 that is not covered by the second resist pattern can be removed during or after the developing process applied to the second resist pattern. The plurality of openings are formed in the second resist layer, exposing the desired openings of the first resist pattern 160. The padding openings of the first resist pattern 160 are covered by the second resist pattern 168 as illustrated in FIG. 8H. In one embodiment, the second lithography process may use a lithography apparatus and the second mask with precisions lower than those of the first lithography process.

Referring to FIGS. 7 and 8I through 8J, the method 176 proceeds to step 184 by etching the material layer 150 through the desired openings of the first resist pattern 160. An etching process is applied to the material layer 150 to remove the material layer within the desired openings to form trenches 174 in the material layer as illustrated in FIG. 8I. In one example, the material layer within the desired openings is removed by the etching process such that the top surfaces of the substrate 148 within the desired openings are fully exposed. Etchant used in the etching process can be chosen and/or tuned to selectively remove the material layer relative to the first resist pattern and the second resist pattern.

Both the first resist pattern 152 and the second resist pattern 168 are removed thereafter. The interfacial layer 166 is removed as well. In various embodiments, a resist ashing process or a wet stripping process is used to remove the first and second resist patterns. After the removal of the first and second resist patterns, the substrate 148 is exposed within the trenches 174 defined in the material layer 150 as illustrated in FIG. 8J. The patterned material layer has trenches 174 defined by the desired openings. In one example, the trenches 174 are formed as contact holes for metal interconnects.

Another embodiment of the lithography patterning method is provided below according to the present disclosure. FIG. 9 is a flowchart showing a lithography patterning method 190. FIGS. 10A through 10I are sectional views of one embodiment of a semiconductor device 200 fabricated by the method 190 during various fabrication stages. With reference to FIGS. 9 and 10A through 10I, the method 190 for lithography patterning and the semiconductor device 200 made thereby are collectively described.

Referring to FIGS. 9 and 10A through 10C, the method 190 begins at step 192 by forming a first resist pattern on a substrate 148. In one example, the first resist pattern 160 of the semiconductor device 186 is substantially similar to the first resist pattern 160 of the semiconductor device 146 in terms of composition, formation, and configuration. For example, the first resist pattern includes at least one desired opening and at least one padding opening. In another example, the desired opening is defined for the expected feature of the semiconductor device 186. The padding opening is configured to reduce the CD deviation caused by the loading effect.

Referring to FIGS. 9 and 10D, the method 190 proceeds to step 194 by forming a photosensitive shrink material layer 202 on the first resist pattern 160 and on the material layer 150 within the openings of the first resist pattern as shown in FIG. 10D. The photosensitive shrinkage material 202 includes photoacid generator (PAG). The PAG can be ionic type or nonionic type. FIGS. 11A through 11K provide various embodiments of the chemical structure of a PAG used in the photosensitive shrinkage material. The photosensitive shrinkage material 202 also includes crosslinkable polymer. In one embodiment, the crosslinkable polymer has an OH group and/or a COOH group such as those crosslinkable polymers shown in FIGS. 12A and 12B. In another embodiment, the crosslinkable polymer includes epoxy. The photosensitive shrinkage material 202 also includes crosslinker. FIG. 13 provides one example of a crosslinker used in the photosensitive shrinkage material. The photosensitive shrinkage material has the function of the RELACS material to form an interfacial layer by crosslinking the crosslinkable polymer. The photosensitive shrinkage material also has the function of a resist material that can be patterned by a lithography patterning process.

Referring to FIGS. 9 and 10E, the method 190 proceeds to step 196 by applying a RELACS process to the photosensitive shrinkage material layer 202 and the first resist pattern 160. In one embodiment, the RELACS process includes baking the photosensitive shrinkage material layer 202 and the first resist pattern 160 to crosslink the crosslinkable polymer, resulting in an interfacial crosslinked polymer layer (an interfacial layer) 204 between the photosensitive shrinkage material layer and the first resist pattern. In one embodiment, the baking process is substantially similar to the baking process used in the method 130.

Referring to FIGS. 9 and 10F through 10G, the method 190 proceeds to step 198 by patterning the photosensitive shrinkage material layer 202, by a second lithography process utilizing a second mask 170 defining at least one desired opening and at least one padding opening as illustrated in FIG. 10F. The photosensitive shrinkage material layer is lithography exposed to form a plurality of exposed regions 206 (or non-exposed region for the negative type) defined by the second mask 170, and further developed into an photosensitive shrinkage material pattern. The photosensitive shrinkage material pattern is formed by the second lithography process that may include processing steps of soft baking, mask aligning, exposing, post-exposure baking, developing, and hard baking. After the photosensitive shrinkage material layer is developed, the plurality of openings are defined therein, exposing the desired openings of the first resist pattern 160. The padding openings of the first resist pattern 160 are covered by the photosensitive shrinkage material pattern as illustrated in FIG. 10G. In one embodiment, the second lithography process may use a lithography apparatus and the second mask with precisions lower than those of the first lithography process since the second resist pattern is used to fully cover the padding openings of the first resist pattern.

Referring to FIGS. 9 and 10H through 10I, the method 190 proceeds to step 199 by etching the material layer 150 through the desired openings of the first resist pattern 160. An etching process is applied to the material layer 150 to remove the material layer within the desired openings to form trenches 174 therein as illustrated in FIG. 10H. In one example, the material layer 150 within the desired openings is removed by the etching process such that the top surfaces of the substrate 148 within the desired openings are fully exposed. Etchant used in the etching process can be chosen and/or tuned to selectively remove the material layer relative to the first resist pattern and the second resist pattern.

Both the first resist pattern 152 and the photosensitive shrinkage material pattern 202 are removed thereafter. A resist ashing process or a wet stripping process is used to remove the first resist pattern and the photosensitive shrinkage pattern. The interfacial layer 166 is removed as well. After the removal of the first resist pattern and the photosensitive shrinkage material pattern, the substrate 148 is exposed within the trenches 174 defined in the material layer 150 as illustrated in FIG. 10I. The patterned material layer has trenches 174 defined by the desired openings. In one example, the trenches 174 include contact holes for metal interconnects.

The lithography patterning method is described above in various embodiments, including the methods 130, 176, and 190. The disclosed lithography patterning method provides a patterning process constructed according to various aspects of the present disclosure. This method implements the PAU process and the RELACS process to form openings in the substrate with reduced CD variation and improved resolution. Other advantages may further present in various embodiments. For example, the openings 174 formed in the material layer 150 have smoother edges and/or reduced dimensions.

Other modifications, variations, additions, and extensions may be used without departing from the scope of the disclosure. For example, the material layer 150 may be eliminated. The first and second resist patterns (or the resist pattern and the photosensitive shrinkage material pattern) are directly formed on the substrate 148. In another example, other proper processes, such as chemical mechanical polishing (CMP), may be implemented for partially removing the material layer 150. In another example, the various masks may utilize other resolution enhancement technologies, such as phase shift mask, optical proximity correction, and/or off-axis illumination. Additionally, a bottom anti-reflective coating (BARC) layer may be formed on the first resist pattern for reducing reflection during lithography exposing processes. In this case, the RELACS process may also be applied to the BARC layer.

Thus the present disclosure provides a method of lithography patterning. The method includes forming a resist pattern on a substrate, the resist pattern including at least one desired opening and at least one padding opening therein on the substrate; forming a patterned photosensitive material layer on the resist pattern and the substrate, wherein the patterned photosensitive material layer covers the padding opening of the resist pattern; and applying a resolution enhancement lithography by assist of chemical shrink (RELACS) process to the desired opening of the resist pattern.

The disclosed method may further include etching the substrate through the desired opening of the resist pattern. The forming of the patterned photosensitive material layer may be performed after the applying of the RELACS process. The forming of the patterned photosensitive material layer may include forming a patterned positive resist layer. The forming of the patterned photosensitive material layer comprises forming a patterned negative resist layer. The patterned photosensitive material layer may include a RELACS material and photoacid generator. The applying of the RELACS process may include a crosslinking reaction to form an interfacial layer at an interface between the photosensitive material layer and the resist pattern at a raised temperature. The applying of the RELACS process may include applying high temperature baking to the photosensitive material layer and the resist pattern. The high temperature baking may include a baking temperature ranging between about 100° C. and about 200° C.

The present disclosure also provides a lithography patterning method. The method includes forming a first resist pattern on a substrate, the resist pattern including at least one desired opening and at least one padding opening therein on the substrate; applying a resolution enhancement lithography by assist of chemical shrink (RELACS) process to shrink the desired opening of the first resist pattern; and forming a second resist pattern on the substrate, covering the padding opening and exposing the desired opening of the first resist pattern.

In the disclosed method, the forming of the second resist pattern may include forming the second resist pattern partially on the first resist pattern. The forming of the second resist pattern may include coating one of a positive resist layer and a negative resist layer on the substrate. The applying the RELACS process may include coating a RELACS material layer on the substrate and the resist pattern; and baking the resist pattern and RELACS material layer at a raised temperature to form an interfacial layer adjacent sidewall of the desired opening. The method may further include rinsing the RELACS material layer before the forming of the second resist pattern. The method may further include rinsing the RELACS material layer during the forming of the second resist pattern. The method may further include etching the substrate through the desired opening of the first resist pattern. The applying of the RELACS process may include coating a RELACS material layer having crosslinkable polymer and crosslinker.

The present disclosure also provides a lithography patterning method. The method includes forming a resist pattern on a substrate, the resist pattern including at least one desired opening and at least one padding opening therein on the substrate; forming a photosensitive shrinkage material layer on the substrate and the resist pattern; baking the photosensitive shrinkage material layer and the resist pattern to form an interfacial layer therebetween; and patterning the photosensitive shrinkage material layer to cover the substrate within the padding opening and expose the substrate within the desired opening of the resist pattern. In one embodiment, the photosensitive shrinkage material layer includes photoacid generator; crosslinkable polymer; and crosslinker. The crosslinkable polymer may include an element selected from the group consisting of a polymer with OH, a polymer with COOH, and epoxy.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
    forming a resist pattern on a substrate, the resist pattern including at least one desired opening and at least one padding opening therein on the substrate;
    coating a resolution enhancement lithography by assist of chemical shrink (RELACS) material over the resist pattern to form a RELACS material layer;
    applying a RELACS process to the RELACS material layer to form an interfacial crosslinked polymer layer between the resist pattern and the RELACS material layer and an uncrosslinked polymer layer over the interfacial crosslinked polymer layer; and
    forming a patterned photosensitive material layer on the uncrosslinked polymer layer, wherein the patterned photosensitive material layer covers the padding opening of the resist pattern.

2. The method of claim 1, further comprising etching the substrate through the desired opening of the resist pattern.

3. The method of claim 1, wherein the forming of the patterned photosensitive material layer comprises forming a patterned positive resist layer.

4. The method of claim 1, wherein the forming of the patterned photosensitive material layer comprises forming a patterned negative resist layer.

5. The method of claim 1, wherein the patterned photosensitive material layer comprises the RELACS material and photoacid generator.

6. The method of claim 5, wherein the applying of the RELACS process comprises a crosslinking reaction to form the interfacial crosslinked polymer layer at an interface between the RELACS material layer and the resist pattern at a raised temperature.

7. The method of claim 1, wherein the applying of the RELACS process comprises applying high temperature baking to the RELACS material layer and the resist pattern.

8. The method of claim 7, wherein the high temperature baking comprises a baking temperature ranging between about 100° C. and about 200° C.

9. The method of claim 1, wherein applying the RELACS process causes the diffusion of an acid from the resist pattern into a portion of the RELACS material layer.

10. A method comprising:
    forming a first resist pattern on a substrate, the first resist pattern including at least one desired opening and at least one padding opening therein on the substrate;
    forming a resolution enhancement lithography by assist of chemical shrink (RELACS) material layer over the first resist pattern;
    applying a RELACS process to the RELACS material layer to form an interfacial crosslinked polymer layer between the first resist pattern and the RELACS material layer and an uncrosslinked polymer layer over the interfacial crosslinked polymer layer; and
    forming a second resist pattern on the uncrosslinked polymer layer, covering the padding opening and exposing the desired opening of the first resist pattern.

11. The method of claim 10, wherein the forming of the second resist pattern comprises forming the second resist pattern partially on the first resist pattern.

12. The method of claim 10, wherein the forming of the second resist pattern comprises coating one of a positive resist layer and a negative resist layer on the substrate.

13. The method of claim 10, wherein the applying the RELACS process comprises:
    baking the first resist pattern and RELACS material layer at a raised temperature to form the interfacial crosslinked polymer layer adjacent a sidewall of the desired opening.

14. The method of claim 13, further comprising rinsing a portion of the RELACS material layer uncovered by the second resist pattern after the forming of the second resist pattern.

15. The method of claim 13, further comprising rinsing a portion of the RELACS material layer uncovered by the second resist pattern during the forming of the second resist pattern.

16. The method of claim 10, further comprising etching the substrate through the desired opening of the first resist pattern.

17. The method of claim 10, wherein the RELACS material layer has a crosslinkable polymer and a crosslinker.

* * * * *